United States Patent [19]
Kouno et al.

[11] Patent Number: 5,520,501
[45] Date of Patent: May 28, 1996

[54] WAFER HOLDING APPARATUS

[75] Inventors: Gisuke Kouno; Takuji Ashikari, both of Ooita, Japan

[73] Assignee: Kabushiki Kaisha Toshiba, Kawasaki, Japan

[21] Appl. No.: 441,495

[22] Filed: May 15, 1995

Related U.S. Application Data

[63] Continuation of Ser. No. 255,884, Jun. 7, 1994, abandoned, which is a continuation of Ser. No. 824,310, Jan. 23, 1992, abandoned.

[30] Foreign Application Priority Data

Jan. 25, 1991 [JP] Japan ................................ 3-007945

[51] Int. Cl.⁶ ....................................... B65G 47/90
[52] U.S. Cl. ................... 414/741; 901/33; 901/37; 901/47; 417/730; 417/738; 417/941; 294/119.1; 294/907
[58] Field of Search ................ 269/40, 46; 118/500, 118/730; 204/298.15; 294/86.41, 119.1, 907; 414/225, 730, 741, 744.8, 751, 941, 738; 901/33, 37, 39, 47, 35

[56] References Cited

U.S. PATENT DOCUMENTS

| | | | |
|---|---|---|---|
| 4,260,187 | 4/1981 | Bejczy | 901/35 X |
| 4,479,673 | 10/1984 | Inaba et al. | 294/119.1 X |
| 4,823,736 | 4/1989 | Post et al. | 118/730 |
| 4,886,361 | 12/1989 | Fürstenau | 901/33 X |
| 4,886,412 | 12/1989 | Wooding et al. | 414/941 X |
| 4,904,153 | 2/1990 | Iwasawa et al. | 414/735 |
| 5,116,181 | 5/1992 | Severns et al. | 414/222 |
| 5,163,729 | 11/1992 | Borcea et al. | 294/119.1 |
| 5,181,823 | 1/1993 | Hussey et al. | 414/730 |

FOREIGN PATENT DOCUMENTS

| | | | |
|---|---|---|---|
| 3023894 | 1/1982 | Germany | 294/86.41 |
| 271298 | 8/1989 | Germany | 901/33 |
| 59-61535 | 4/1984 | Japan | |
| 1-261843 | 10/1989 | Japan | |

OTHER PUBLICATIONS

Fairchild Inc. CCD3000 Camera Brochure "Video Comm. Camera Automation Camera Series"; copyright 1982; Fairchild Camera & Instrument Corp, Palo Alto, CA. 94304.

*Primary Examiner*—David A. Bucci
*Assistant Examiner*—Stephen Gordon
*Attorney, Agent, or Firm*—Finnegan, Henderson, Farabow, Garrett & Dunner

[57] ABSTRACT

A wafer holding apparatus comprises a susceptor unit having wafer support grooves where wafers are detachably fixed, a plurality of chuck claws so provided as to be movable by air cylinders relative to a chuck body and adapted to hold the outer edge of the wafer, a transfer arm for transferring the chuck body to a predetermined position, and an automatic position correcting device for automatically correcting the positions of the chucks relative to the wafer support groove.

5 Claims, 7 Drawing Sheets

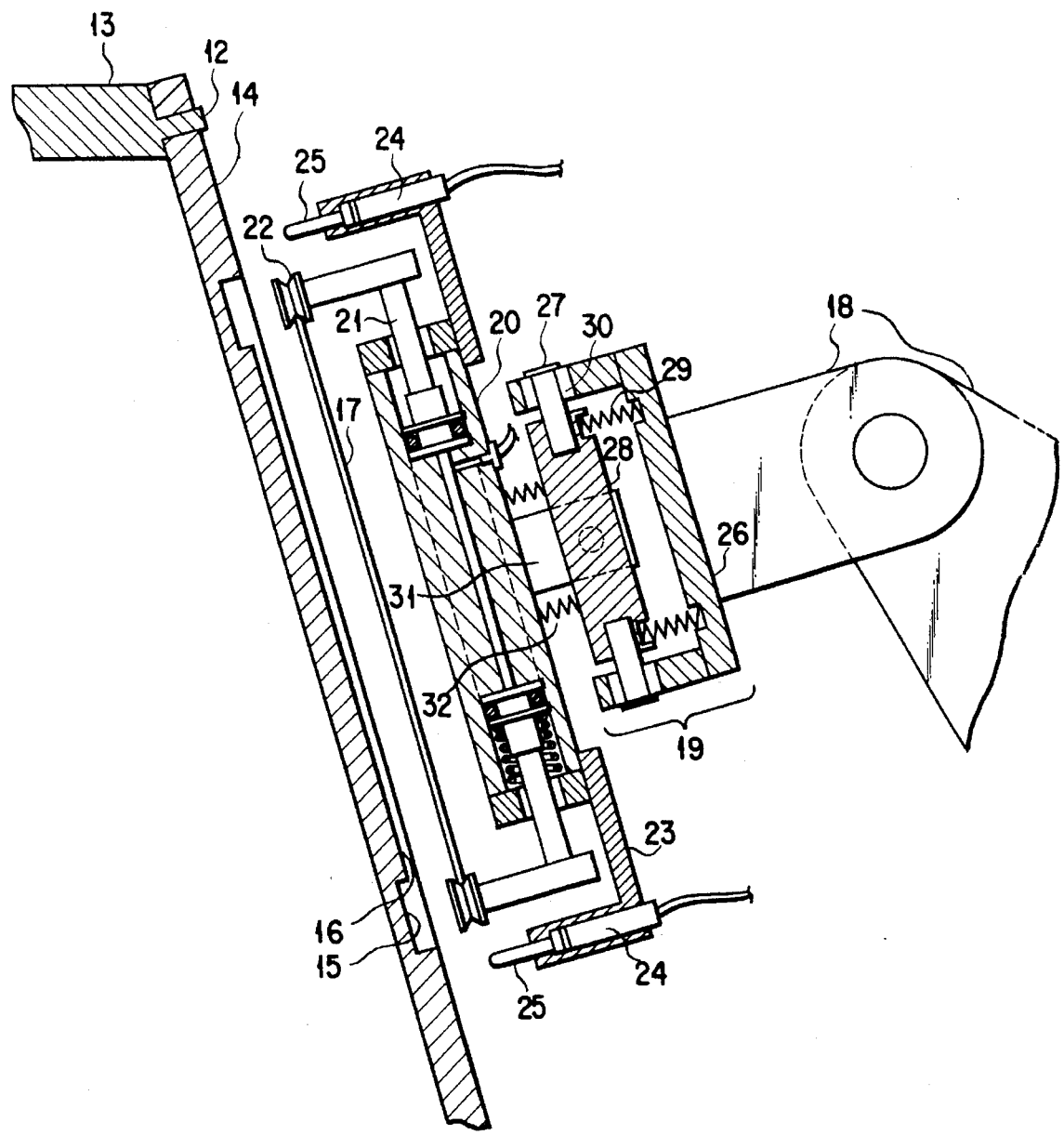
F I G. 2

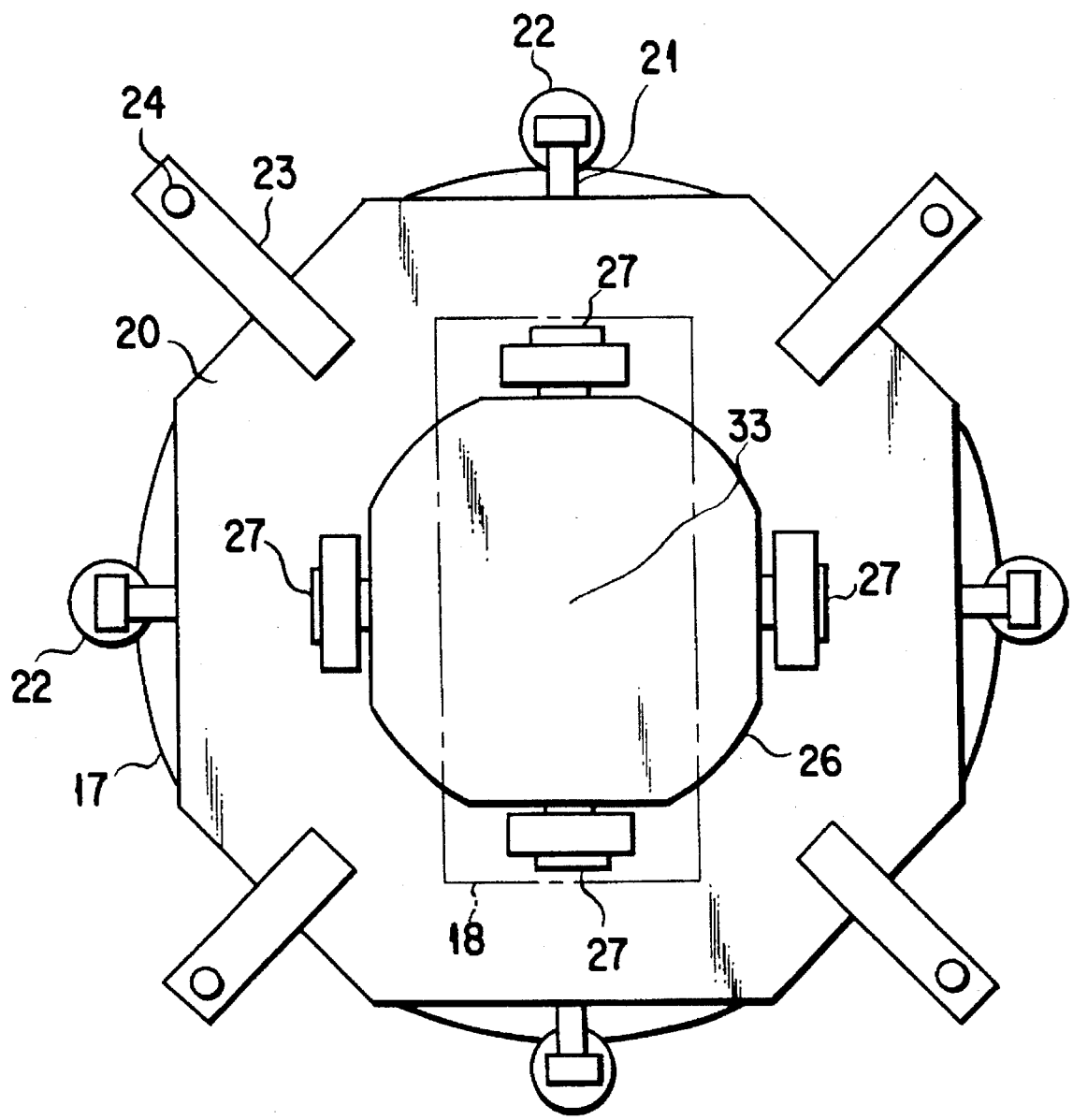
F I G. 3

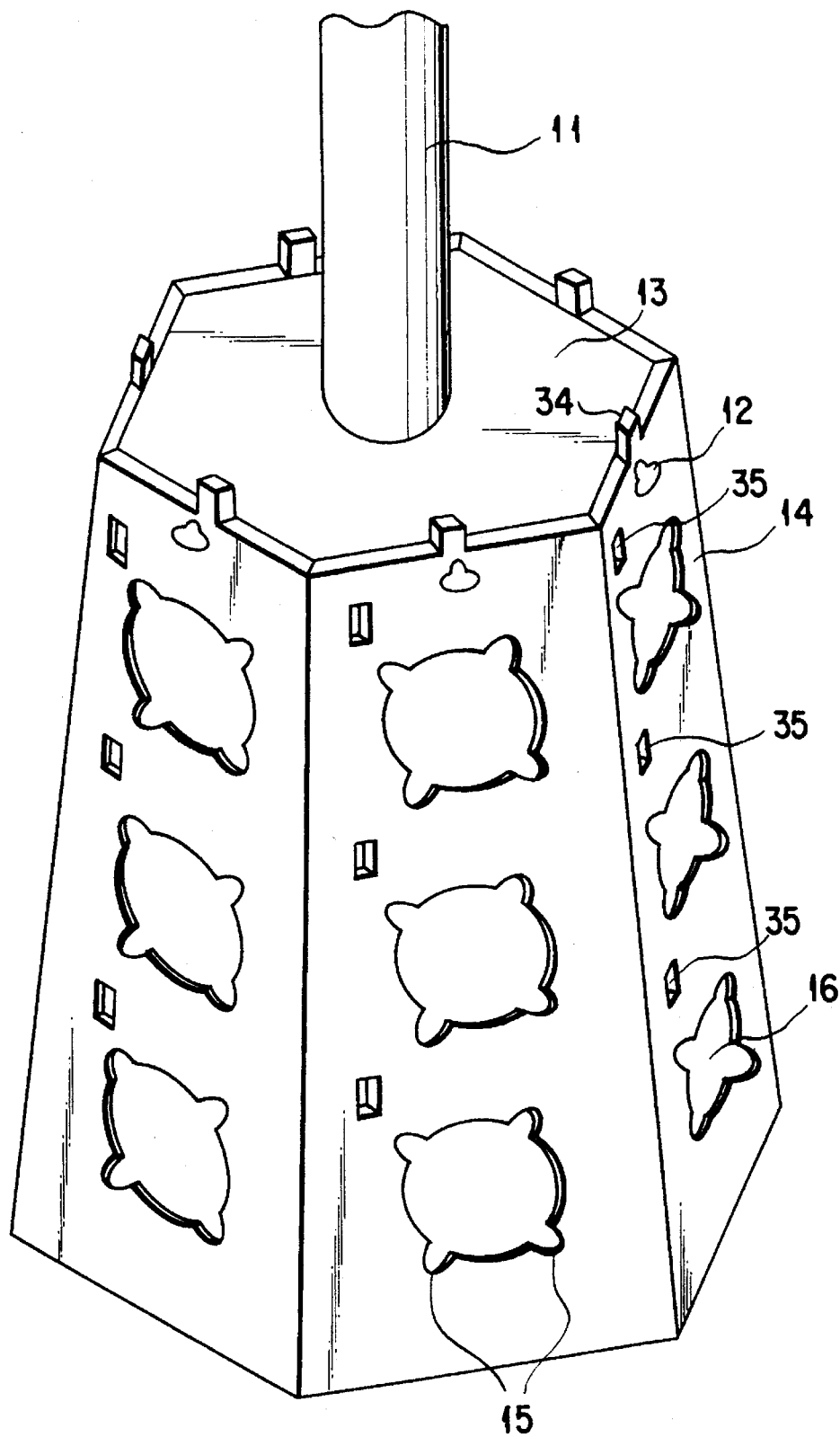
F I G. 7

WAFER HOLDING APPARATUS

This application is a continuation of application Ser. No. 08/255,884, filed Jun. 7, 1994, now abandoned, which is a continuation of U.S. Ser. No. 07/824,310 filed Jan. 23, 1992, now abandoned.

BACKGROUND OF THE INVENTION

1. Field of the Invention

The present invention relates to a wafer holding apparatus suitable for use in the automatic attachment and detachment of wafers to and from a susceptor unit in a process for the manufacture of a semiconductor device.

2. Description of the Related Art

Generally the process for the manufacture of a semiconductor device includes a step for epitaxially forming a thin film on the surface of a wafer. The epitaxial step comprises attaching wafers to wafer support grooves in a susceptor made of carbon, heating each wafer in a reaction furnace and forming a desired thin film while supplying a predetermined gas in the reaction furnace. In this case, the attachment and detachment of the wafer to and from the susceptor are achieved using a wafer holding apparatus.

This type of wafer holding apparatus has conventionally been constructed as shown, for example, in FIG. 1. During the operation of the apparatus, a chuck body 5 fixed to the forward end of a transfer arm 6 is moved between a standby station 9 having wafers 7 waiting for treatment and the susceptor 2 so that the wafer is transferred. The wafer 7 is held by claws 3 mounted by air cylinders 4 on the chuck body 5. The attachment and detachment of the wafer 7 to and from a wafer support groove 8 in the susceptor 2 are effected by opening and closing the chuck claws 3 by means of air cylinders 4. The wafer holding position of the chuck claw 3 and wafer placing position at the wafer support groove 8 of the susceptor 2 are initially set up by coinciding the stop position of the transfer arm 6 with that of the susceptor 2 side and these positions are provided as fixed positions.

In FIG. 1, reference numeral 1 shows a support plate for supporting six susceptors 2 arranged, for example, in a hexagonal configuration.

The aforementioned wafer holding apparatus is of such a type that the wafer 7 is attached and detached to and from the wafer support groove 8 in the susceptor 2 with the chuck body 5 fixed to the forward end of the transfer arm 6. In this case, the wafer 7 held by the chuck claws 3 on the wafer 7 side is held at all times in a fixed position.

The susceptor 2 is held in position such that it is suspended in a manner to surround the outer periphery of the hexagonal support plate 1. The attachment and detachment of the wafer 7 are sequentially effected relative to six susceptors at a time by rotating the support plate 1. During the process of manufacture, a manufacturing error, though being somewhat slight, is produced between the susceptor 2 and the support plate 1. Relative to the wafer 7 held on the susceptor 2 side by the chuck claws 3, the wafer support groove 8 is not located at all times in a predetermined position for a reason as set out above and some positional displacement is produced, upon attachment, relative to the individual susceptor 2.

The positional displacement causes a misalignment to be produced between the wafer and the wafer support groove 8. As a result, a clearance is produced between the susceptor 2 and the wafer 7, dropping the wafer 7 out of the wafer support groove 8 and causing damage to the wafer. Upon detachment, the wafer 7 cannot be properly held by the chuck claws 3 and the wafer 7 is dropped out of the groove 8 and suffers damage.

It is usually desirable that a thin film treatment be effected in an intimate wafer-to-susceptor contact state. Any clearance, if being produced, causes a poor or defective film to be formed on the wafer 7.

SUMMARY OF THE INVENTION

It is accordingly the object of the present invention to provide a wafer holding apparatus which, even if any slight displacement of a susceptor occurs, can stably and positively mount each wafer in a corresponding wafer support groove in a detachable way without causing a damage to the wafer.

The wafer holding apparatus of the present invention comprises a susceptor having wafer support grooves where wafers are detachably fixed; a plurality of chuck claws so provided as to be movable by air cylinders relative to the chuck body and adapted to hold an outer edge of the wafer; a transfer arm for transferring the chuck body to a predetermined position; and automatic position correcting means for automatically correcting the positions of the chucks relative to the wafer support groove.

According to the present invention, the wafer holding apparatus includes an automatic position correcting means and, even if any slight positional displacement of the susceptor occurs, can stably or positively mount each wafer in a corresponding wafer support groove in a detachable way without causing damage to the wafer.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 is a cross-sectional view, partly taken away, showing a wafer holding apparatus according to a first embodiment of the present invention;

FIG. 3 is a plan view showing an area near a universal support mechanism in the wafer holding apparatus of the present invention;

FIG. 7 is a perspective view showing another form of an assembling type susceptor in the present wafer holding apparatus of FIG. 5.

DETAILED DESCRIPTION OF THE PREFERRED EMBODIMENTS

Figure 4:
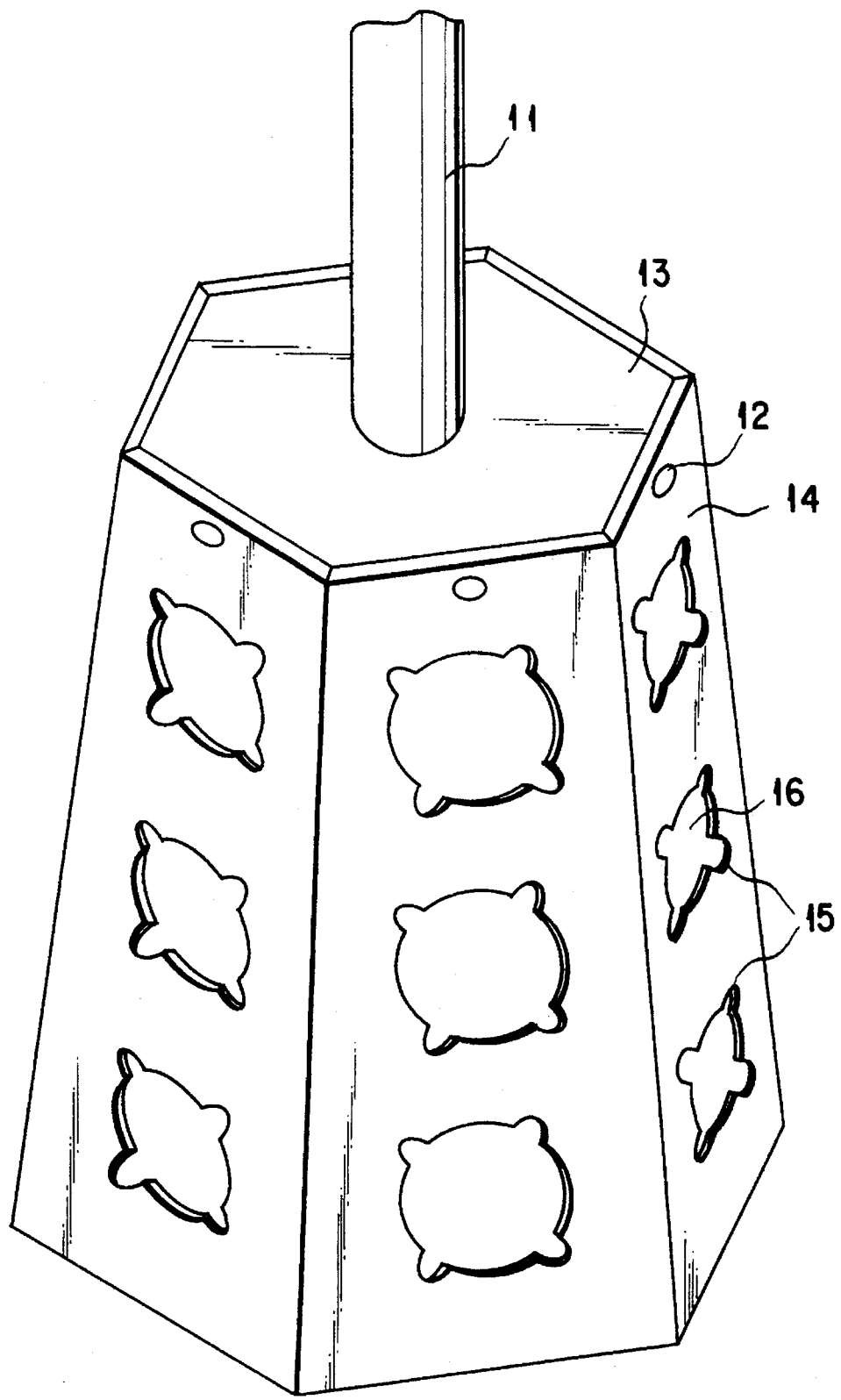
FIG. 4 is a perspective view showing one form of an assembling type susceptor for the present wafer holding apparatus.

A wafer holding apparatus of the present invention is so constructed as shown in FIGS. 2 to 4: FIG. 2 being a cross-sectional view showing a whole arrangement of the wafer holding apparatus, FIG. 3 being a plan view showing an area near an universal support mechanism, and FIG. 4 being a perspective view showing an assembled susceptor unit.

First, the susceptor unit is so arranged as shown in FIG. 4. A support plate 13 of a polygonal configuration, such as a hexagonal one, is fixed to one end of a hanger rod 11 such that hooks 12 are formed integral therewith and projected from its side surface. The susceptor 14 is substantially rectangular in configuration and is latched to the hook 12 and suspended in a manner to surround each side surface of the support plate 13. A plurality of circular wafer support grooves 16, for example, three ones, are provided in the respective susceptor 14 with four, outwardly extending recesses 15 formed in each. As evident from FIG. 2, the outwardly extending recesses 15 are formed more deeply than a major area of the wafer support groove 16 so as to correspond to the associated chuck claws as will be set out below.

Figure 1:
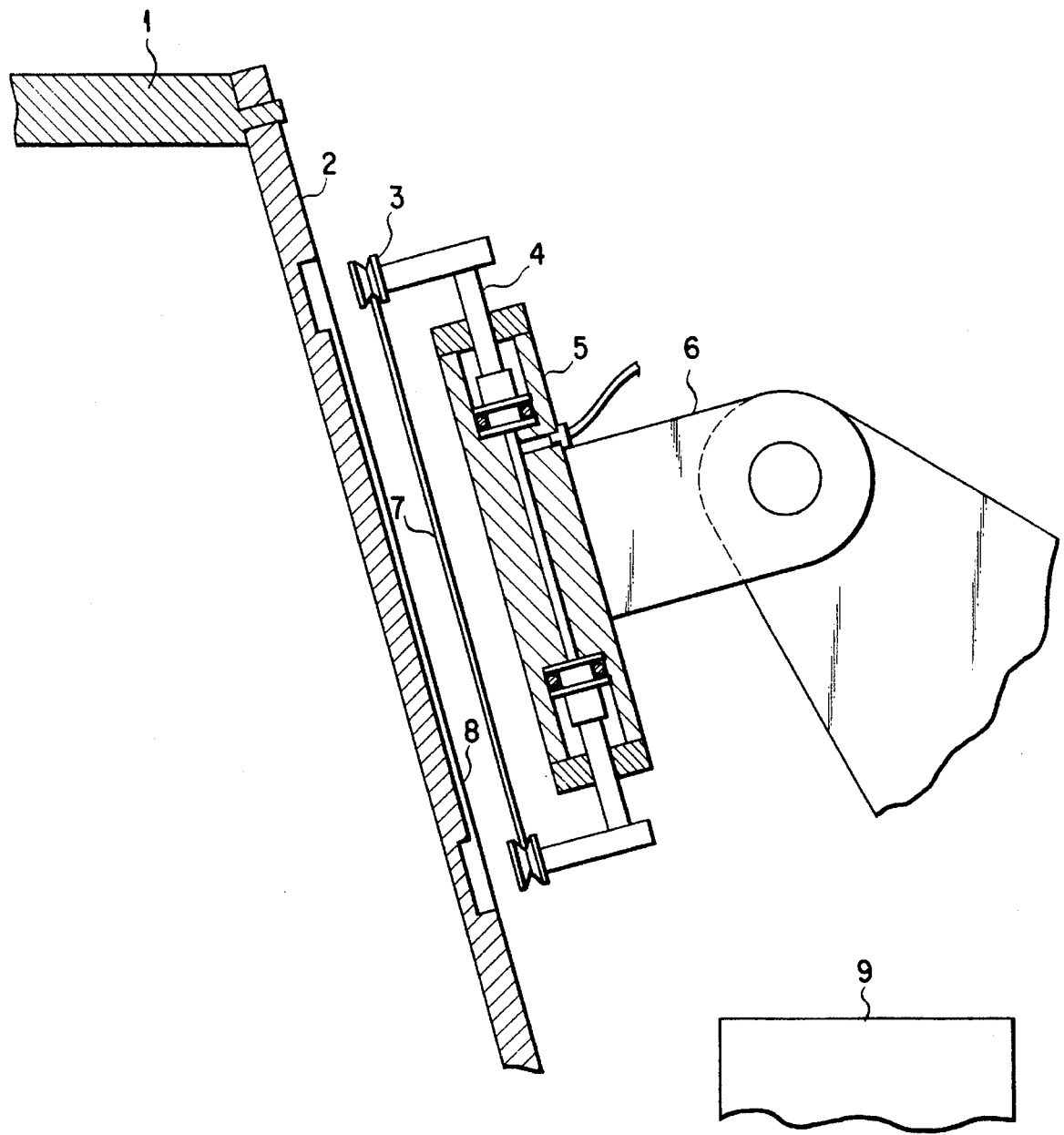
FIG. 1 is a cross-sectional view, partly taken away, showing a conventional wafer holder apparatus.

Though being not shown in FIGS. 2 to 4, a standby station for wafers waiting for treatment is provided as in the case of the conventional apparatus (See 9 in FIG. 1).

As shown in FIG. 2, a transfer arm 18 is rotatably mounted for transferring the wafer 17 between the suspector 14 and the standby station. A chuck body 20 is mounted by a universal supporting mechanism 19 on the forward end of the transfer arm 18. As evident from FIG. 3, four air cylinders 21 are incorporated in the chuck body 20 on the diagonal lines. Chuck claws 22 are mounted on the air cylinders 21 and the wafer 17 is held at the V-groove sites of the chuck claws 22 by actuating the air cylinders 21.

A detecting means is provided on the chuck body 20 to detect the distance between the chuck claw 22 and the susceptor 14. The detecting means comprises gap sensor support pieces 23 each located between two adjacent air cylinders 21 and mounted on the chuck body 20 in a manner to project from the chuck body 20, gap sensors 24 each supported on the gap sensor support piece 23, and sensing pins 25 each provided on the forward end of the gap sensor 24.

An explanation will now be given below about the universal support mechanism 19.

A transfer arm fixing plate 26 is fixed to the forward end of the transfer arm 18. A support plate 28 is mounted by support pins 27 on the transfer arm fixing plate 26 such that it is rotatable in a predetermined direction and returned by returning springs 29 back to an initial position. In this case, bearings 30 are each buried in the side wall of the transfer arm fixing plate 26 and support pins 27 are each projected from the support plate 28 and fixed to the bearing 30. Thus the support plate 28 is rotatable in a predetermined direction with the support pin 27 as a supporting point. Further, a chuck body support rod 31 is mounted on the chuck body 20 and supported on the support plate 28 such that it is rotatable in a predetermined direction. Return springs 32 are provided between the support plate 28 and the chuck body 20 to return the chuck body 20 back to an initial position. As a result, the chuck body 20 can be tilted in any peripheral direction with an intersecting point 33 of the four support pins 27 as a center (See FIG. 3) and can be moved, at all times, parallel to the susceptor 14.

In the epitaxial process of manufacturing a semiconductor, the wafer 17 is mounted in the wafer support groove 16 on the susceptor 14 with the use of the wafer support apparatus as will be set out below. That is, the wafer 17 is held, by the chuck claws 22, at the location of the standby station, not shown, and transferred to the wafer support groove 16 on the susceptor 14 by actuating the transfer arm 18 at which time the position of the susceptor 14 is detected by bringing the sensing pins 25 into contact with the surface of the susceptor 14. The wafer holding apparatus thus constructed evaluates the detection signals by a computing processing circuit, not shown, and delivers a correction signal corresponding to the tilt and depth of the chuck claws 22 relative to the wafer support groove 16 to the transfer arm 18 so that the distance between the susceptor 14 and the chuck claw 22 can be maintained at all times constant through the universal support mechanism 19. As the universal support mechanism 19 is so constructed as set out above, it is possible to automatically correct the position of the tilt and depth of the wafer 17 relative to the wafer support groove 16 of the susceptor 14.

Second Embodiment

In the aforementioned embodiment, the tilt and depth of the chuck claw 22 relative to the wafer support groove 16 are positionally corrected automatically, but the second embodiment of the present invention corrects not only the tilt and depth but also the upper/lower and right/left direction.

Figure 5:
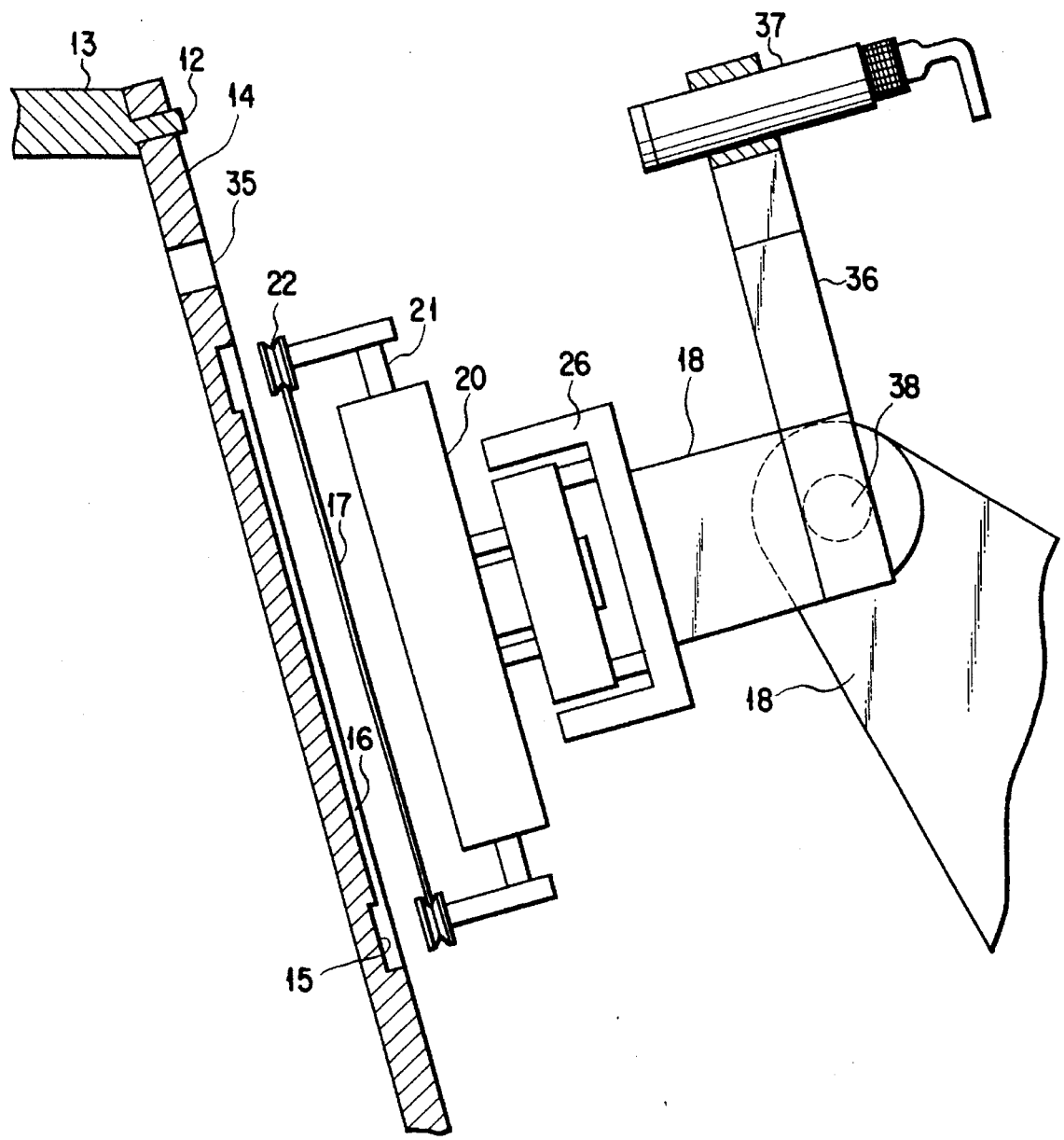
FIG. 5 is a perspective view showing a wafer holding apparatus according to another embodiment of the present invention.
Figure 6:
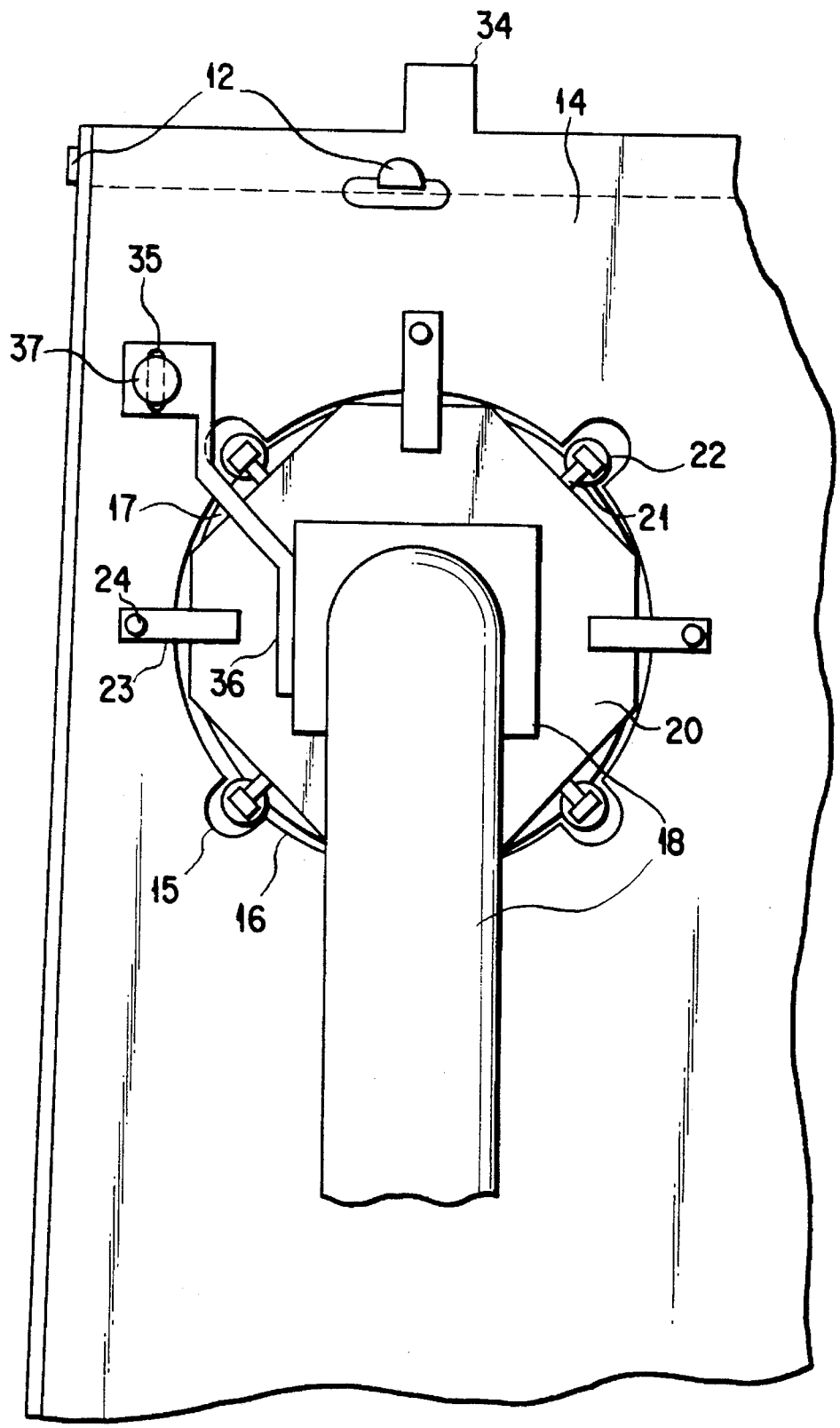
FIG. 6 is a plan view showing an area near a universal support mechanism in the present wafer holding apparatus.

The second embodiment is so constructed as shown in FIGS. 5 to 7 in which the same reference numerals are employed to designate parts or elements corresponding to those shown in the preceding embodiment. An explanation will be given below about only the different points between these embodiments. As shown in FIG. 7, hooks 34 are each provided integral with a susceptor 14 such that they are located at the top end faces of the susceptors 14, that is, at those areas near the support plate 13. Position detection holes 35 are each provided near the respective wafer groove 16.

A means for detecting the position detection hole 35, such as a CCD camera 37, is attached by a support arm 36 to the transfer arm 18 as shown in FIGS. 5 and 6. The CCD camera 37 is so provided as to correspond to the position detection hole 35 and is rotatable with a supporting point 38 as a center. The CCD camera 37 is connected to a computing processing circuit, not shown.

Even in the second embodiment, a detecting means for detecting the distance between the chuck claw 22 and the susceptor 14 is provided as in the preceding embodiment, but it is omitted for brevity's sake. FIG. 6 shows gap sensor support pieces 23 and gap sensors 24.

Except those as set out above, the second embodiment is the same as the preceding embodiment (FIGS. 2 and 3) in its arrangement and any further explanation is, therefore, omitted.

The apparatus of the second embodiment can move the transfer arm 18 to a reference setting position (teaching point) at a time of operation, input an image of the position detection hole 35 to the computing processing circuit by the CCD camera 37 and perform an image processing for positional correction. In this case, the apparatus performs the binary conversion of an image as a processing content, computes the X, Y coordinate values and area, compares the area with a reference area and determines whether the input state is good or not. In the case where the input data is determined as being good, the apparatus can find that center of the area detuated on the X, Y coordinates, correct a deviation of X, Y, and θ from reference coordinate points relative to the transfer arm 18 and automatically move the chuck claws 22 just in the wafer support groove 16 at all times.

According to the present invention, as set out above in detail, the apparatus can stably and positively attach and detach the wafer to and from the wafer support groove, without any damage to the wafer, even if some positional displacement is made relative to the susceptor.

Needless to say, the rear surface of the wafer can be held at all times in an intimate contact state in the susceptor surface, thus obtaining an advantage.

In the conventional wafer holding apparatus, in order to reduce a positional displacement of the susceptor, the support plate provided integral with the surrounding susceptors has to be employed, but it is more expensive than an assembling type susceptor unit and, moreover, has to be wholly replaced by a new one even if any defective groove or grooves occur. According to the present invention, the apparatus allows some displacement of the susceptor and can use an assembling type susceptor unit where the support plate is provided integral with the surrounding individual susceptors.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A wafer holding apparatus comprising:
    a susceptor unit having wafer support grooves provided in a surface of the susceptor unit for detachably fixing at least one wafer on the susceptor unit;
    a chuck body having a plurality of chuck claws adapted to hold an outer edge of the wafer and air cylinders for moving the chuck claws;
    a transfer arm for transferring the chuck body to a predetermined position;
    a universal support mechanism disposed between the transfer arm and the chuck body so that the chuck body can pivot relative to the transfer arm to move the chuck body into a position parallel to the surface of the susceptor unit by means of the transfer arm, the universal support mechanism including a rod mounted to a portion of the chuck body and a support plate rotatably coupled to a portion the rod, the support plate having first and second pairs of pins provided at peripheral portions of the support plate and being oriented along substantially perpendicular axes passing through a substantial center portion of the support plate, at least one of the first and second pairs of pins being rotatably mounted to a portion of the transfer arm;
    sensor supports projecting from the chuck body; and
    gap sensors for sensing a gap between the chuck claws and the susceptor unit, each of the gap sensors being attached to a respective one of the sensor supports and having a sensing pin at a tip end thereof, the sensing pin being positioned to project from the respective one of the sensor supports when a wafer is held by the chuck claws and contacting the surface of the susceptor unit when a wafer held by the chuck claws is placed within one of the wafer support grooves.

2. The wafer holding apparatus of claim 1, further comprising:
    a returning structure for returning the universal support mechanism to a predetermined position, the returning structure including a first returning spring coupled between the support plate and the transfer arm and a second returning spring coupled between the support plate and the chuck body.

3. The wafer holding device of claim 1, wherein the plurality of chuck claws includes a first pair of coaxial chuck claws and a second pair of coaxial chuck claws oriented perpendicular to the first pair of chuck claws, and wherein each of the sensor supports projects from the chuck body between a respective one of the first pair of coaxial chuck claws and a respective one of the second pair of coaxial chuck claws.

4. The wafer holding device of claim 1, wherein the plurality of chuck claws includes at least two coaxial chuck claws movable toward one another from an open position to a wafer holding position so that the two coaxial chuck claws are separated by a wafer holding distance, wherein the sensor supports include at least two opposed sensor supports, and wherein the gap sensors include a first gap sensor attached to one of the opposed sensor supports and a second gap sensor attached to another of the opposed sensor supports, the first and second gap sensors being spaced apart by a distance greater than the wafer holding distance.

5. The wafer holding device of claim 1, wherein the plurality of chuck claws includes a first pair of coaxial chuck claws and a second pair of coaxial chuck claws oriented perpendicular to the first pair of chuck claws, the first and second pairs of coaxial chuck claws being movable from an open position to a wafer holding position, wherein the sensor supports include at least two opposed sensor supports, and wherein the gap sensors include a first gap sensor attached to one of the opposed sensor supports and a second gap sensor attached to another of the opposed sensor supports, the first and second gap sensors being spaced apart by a distance greater than a distance between the first pair of chuck claws when the first pair of chuck claws are in the wafer holding position and greater than a distance between the second pair of chuck claws when the second pair of chuck claws are in the wafer holding position.

* * * * *